(12) United States Patent
He et al.

(10) Patent No.: US 10,020,778 B1
(45) Date of Patent: Jul. 10, 2018

(54) REDUCING AUDIO ARTIFACTS IN AN AMPLIFIER WITH CONFIGURABLE FINAL OUTPUT STAGE

(71) Applicant: Cirrus Logic International Semiconductor Ltd., Edinburgh (GB)

(72) Inventors: Ku He, Austin, TX (US); Tejasvi Das, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/651,314

(22) Filed: Jul. 17, 2017

(51) Int. Cl.
*H03F 3/38* (2006.01)
*H03F 1/02* (2006.01)
*H03F 3/217* (2006.01)
*H03F 3/185* (2006.01)
*H04R 3/04* (2006.01)

(52) U.S. Cl.
CPC ........... *H03F 1/0205* (2013.01); *H03F 3/185* (2013.01); *H03F 3/2171* (2013.01); *H04R 3/04* (2013.01); *H03F 2200/03* (2013.01)

(58) Field of Classification Search
CPC .................................. H03F 3/38; H03F 3/217
USPC ......................................... 330/10, 251, 207 A
See application file for complete search history.

(56) References Cited

U.S. PATENT DOCUMENTS

| | | | | |
|---|---|---|---|---|
| 7,701,283 B2* | 4/2010 | Wu | ......................... | H03F 3/217 330/10 |
| 8,536,938 B2* | 9/2013 | Walker | .................... | H03F 3/217 330/10 |
| 8,633,763 B2* | 1/2014 | Walker | .................... | H03F 3/217 330/10 |
| 9,178,462 B2* | 11/2015 | Kurosawa | ............. | H02P 25/034 |
| 9,306,523 B2* | 4/2016 | Du | ......................... | H03G 3/348 |

OTHER PUBLICATIONS

Combined Search and Examination Report under Sections 17 and 18(3), UKIPO, Application No. GB1713474.3, dated Feb. 16, 2018.
Combined Search and Examination Report under Sections 17 and 18(3), UKIPO, Application No. GB1713473.5, dated Feb. 16, 2018.

* cited by examiner

*Primary Examiner* — Henry Choe
(74) *Attorney, Agent, or Firm* — Jackson Walker L.L.P.

(57) ABSTRACT

An amplifier may include a first stage configured to receive an input signal at an amplifier input and generate an intermediate signal which is a function of the input signal, and a final output stage configured to generate an output signal which is a function of the intermediate signal at an amplifier output, and a signal feedback network coupled between the amplifier output and input. The final output stage may be switchable among a plurality of modes including at least a first mode in which the final output stage generates the output signal as a modulated output signal which is a function of the intermediate signal, and a second mode in which the final output stage generates the output signal as an unmodulated output signal which is a function of the intermediate signal. Control circuitry may reduce audio artifacts associated with switching between modes.

38 Claims, 7 Drawing Sheets

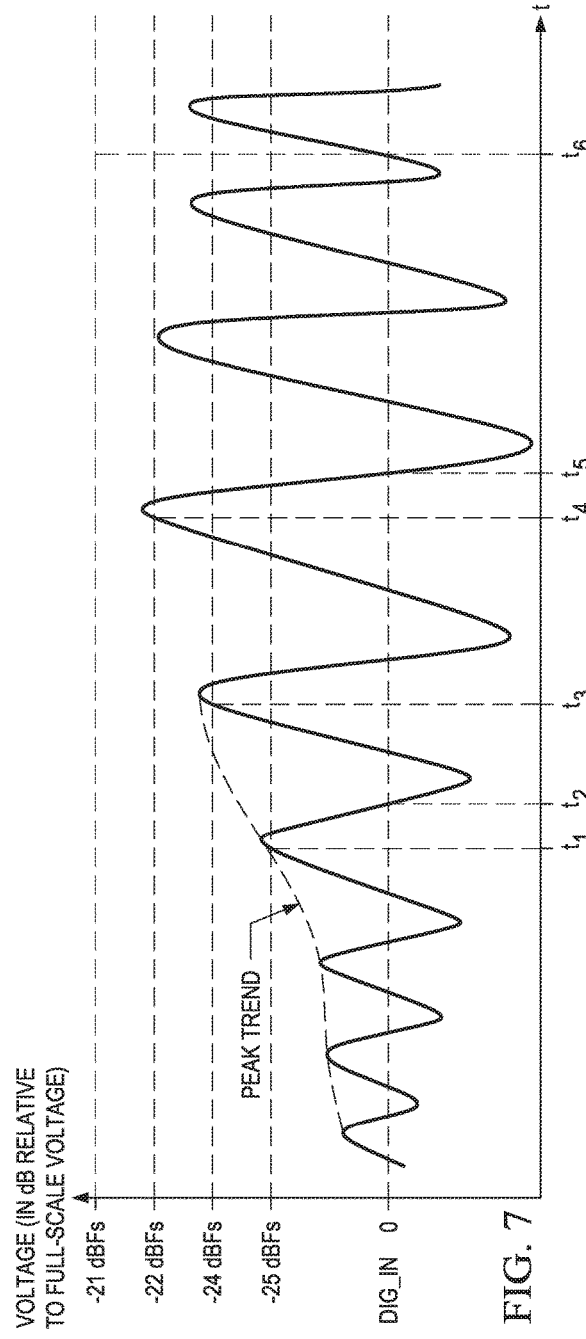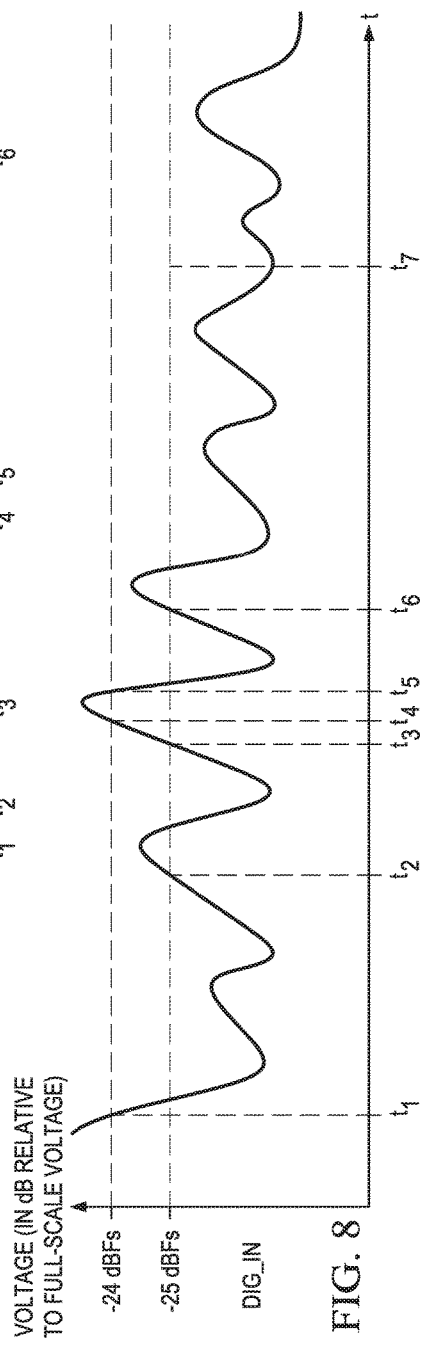
FIG. 7
FIG. 8

US 10,020,778 B1

REDUCING AUDIO ARTIFACTS IN AN AMPLIFIER WITH CONFIGURABLE FINAL OUTPUT STAGE

FIELD OF DISCLOSURE

The present disclosure relates in general to circuits for audio devices, including without limitation personal audio devices, such as wireless telephones and media players, and more specifically, to systems and methods relating to an amplifier with a configurable final output stage.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches, and not as linear gain devices as in other amplifiers (e.g., class-A, class-B, and class-AB amplifiers). In a class-D amplifier, an analog signal to be amplified may be converted to a series of pulses by pulse-width modulation, pulse-density modulation, or other method of modulation, such that the analog signal is converted into a modulated signal in which a characteristic of the pulses of the modulated signal (e.g., pulse widths, pulse density, etc.) is a function of the magnitude of the analog signal. After amplification with a class-D amplifier, the output pulse train may be converted back to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers. However, class-D amplifiers may have high quiescent power when amplifying low-magnitude signals and may require a large amount of area in order to meet stringent dynamic range requirements in audio devices.

SUMMARY

In accordance with the teachings of the present disclosure, one or more disadvantages and problems associated with existing approaches to signal amplification in an audio system may be reduced or eliminated.

In accordance with embodiments of the present disclosure, an apparatus may include an amplifier and a control circuit. The amplifier may include a plurality of stages comprising at least a first stage configured to receive an input signal at an amplifier input and generate an intermediate signal at an intermediate output which is a function of the input signal and a final output stage configured to generate an output signal at an amplifier output, wherein the output signal is a function of the intermediate signal, and a signal feedback network coupled between the amplifier output and the amplifier input, wherein the final output stage is switchable among a plurality of modes including at least: (i) a first mode in which the final output stage generates the output signal as a modulated output signal which is a function of the intermediate signal; and (ii) a second mode in which the final output stage generates the output signal as an unmodulated output signal which is a function of the intermediate signal. The structure of the signal feedback network and the first stage may remain static when switching between the first mode and the second mode. The control circuit may be configured to predict, based on one or more characteristics of a signal indicative of the output signal, an occurrence of a condition for switching between the first mode and the second mode and responsive to predicting the occurrence of the condition, switch between the first mode and the second mode.

In accordance with these and other embodiments of the present disclosure, a method for operating an amplifier having a plurality of stages comprising at least a first stage configured to receive an input signal at an amplifier input and generate an intermediate signal which is a function of the input signal, and a final output stage configured to generate an output signal at an amplifier output, wherein the output signal is a function of the intermediate signal, and a signal feedback network coupled between the amplifier output and the amplifier input, the method comprising, switching the final output stage among a plurality of modes including at least a first mode in which the final output stage generates the output signal as a modulated output signal which is a function of the intermediate signal, and a second mode in which the final output stage generates the output signal as an unmodulated output signal which is a function of the intermediate signal, wherein structure of the signal feedback network and the first stage remain static when switching between the first mode and the second mode and when switching between the second mode and the first mode, is provided. The method may include predicting, based on one or more characteristics of a signal indicative of the output signal, an occurrence of a condition for switching between the first mode and the second mode, and responsive to predicting the occurrence of the condition, switching between the first mode and the second mode.

In accordance with these and other embodiments of the present disclosure, an apparatus may include an amplifier and a control circuit. The amplifier may include a plurality of stages comprising at least a first stage configured to receive an input signal at an amplifier input and generate an intermediate signal at an intermediate output which is a function of the input signal and a final output stage configured to generate an output signal at an amplifier output, wherein the output signal is a function of the intermediate signal, and a signal feedback network coupled between the amplifier output and the amplifier input, wherein the final output stage is switchable among a plurality of modes including at least: (i) a first mode in which the final output stage generates the output signal as a modulated output signal which is a function of the intermediate signal; and (ii) a second mode in which the final output stage generates the output signal as an unmodulated output signal which is a function of the intermediate signal. The structure of the signal feedback network and the first stage may remain static when switching between the first mode and the second mode. The control circuit may be configured to determine a spectral content of a signal indicative of an output signal at the output of the final output stage and switch between the first mode and the second mode based on the spectral content.

In accordance with these and other embodiments of the present disclosure, a method for operating an amplifier having a plurality of stages comprising at least a first stage configured to receive an input signal at an amplifier input and generate an intermediate signal which is a function of the input signal, and a final output stage configured to generate an output signal at an amplifier output, wherein the output signal is a function of the intermediate signal, and a signal feedback network coupled between the amplifier output and the amplifier input, the method comprising, switching the final output stage among a plurality of modes including at least a first mode in which the final output stage generates the output signal as a modulated output signal which is a function of the intermediate signal, and a second mode in which the final output stage generates the output signal as an unmodulated output signal which is a function of the intermediate signal, wherein structure of the signal feedback network and the first stage remain static when switching between the first mode and the second mode and when switching between the second mode and the first mode, is provided. The method may include determining a spectral content of a signal indicative of an output signal at the output of the final output stage and switching between the first mode and the second mode based on the spectral content.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIGS. 7 through 10 illustrate example waveforms demonstrating predictive methodologies performed by the control circuit depicted in FIG. 6, in accordance with embodiments of the present disclosure.

DETAILED DESCRIPTION

Figure 1:
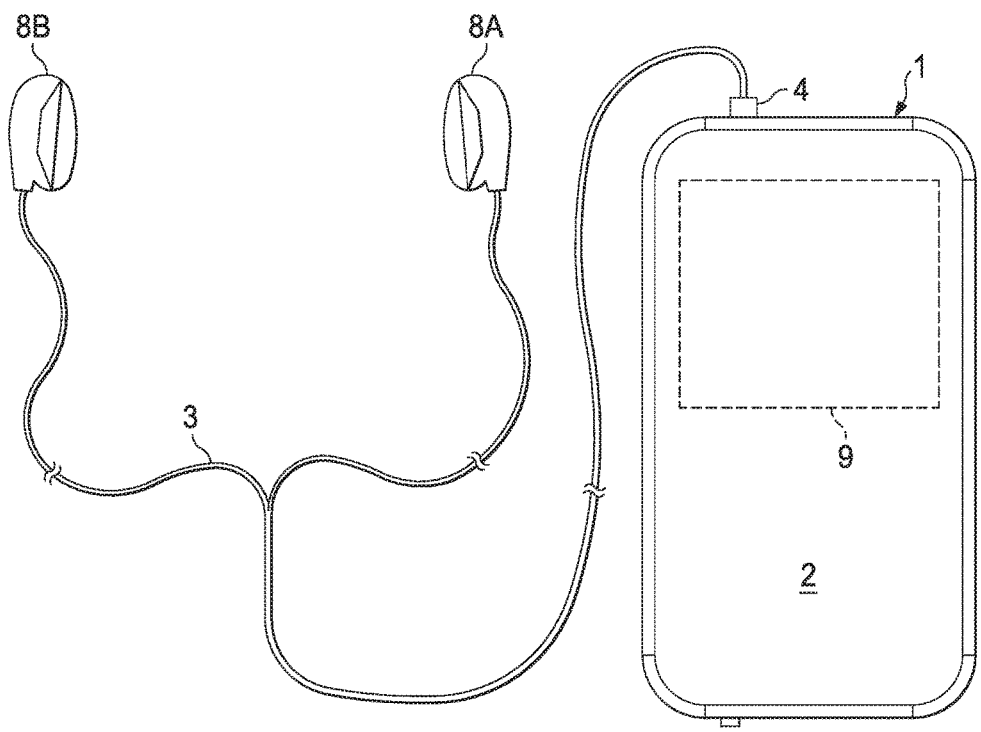
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
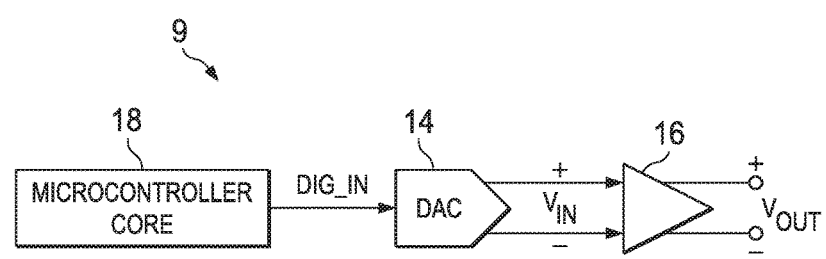
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 may supply a digital audio input signal DIG_IN to a digital-to-analog converter (DAC) 14, which may convert the digital audio input signal to an analog input signal $V_{IN}$. DAC 14 may supply analog signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output.

Figure 3A:
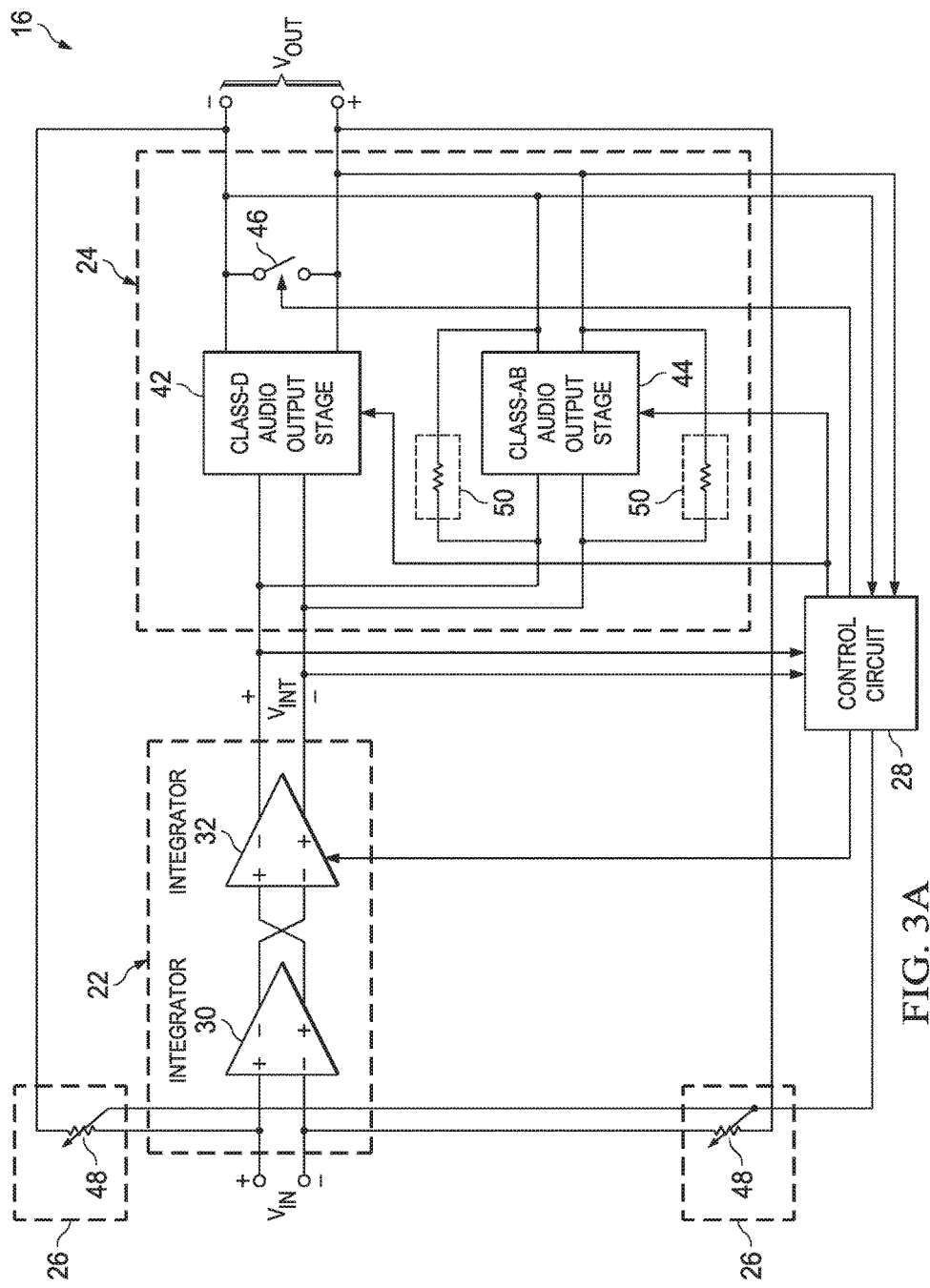
FIG. 3A is a block diagram of selected components of an example amplifier, in accordance with embodiments of the present disclosure.

FIG. 3A is a block diagram of selected components of an example amplifier 16, in accordance with embodiments of the present disclosure. As shown in FIG. 3A, amplifier 16 may include a first stage 22 (e.g., an analog front end) configured to receive analog input signal $V_{IN}$ at an amplifier input of amplifier 16 and generate an intermediate signal $V_{INT}$ which is a function of analog input signal $V_{IN}$, a final output stage 24 configured to generate audio output signal $V_{OUT}$ at an amplifier output of amplifier 16 as a function of intermediate signal $V_{INT}$, a signal feedback network 26 coupled between the amplifier output and the amplifier input, and a control circuit 28 for controlling the operation of certain components of amplifier 16, as described in greater detail below.

First stage 22 may include any suitable analog front end circuit for conditioning analog input signal $V_{IN}$ for use by final output stage 24. For example, first stage 22 may include one or more analog integrators 30 and 32 cascaded in series, as shown in FIG. 3A.

Final output stage 24 may include any suitable driving circuit for driving audio output signal $V_{OUT}$ as a function of intermediate signal $V_{INT}$ (thus, also making audio output signal $V_{OUT}$ a function of analog input signal $V_{IN}$) wherein final output stage 24 is switchable among a plurality of modes including at least a first mode in which final output stage 24 generates audio output signal $V_{OUT}$ as a modulated output signal which is a function of intermediate signal $V_{INT}$ and a second mode in which final output stage 24 generates audio output signal $V_{OUT}$ as an unmodulated output signal which is a function of intermediate signal $V_{INT}$. To carry out this functionality, final output stage 24 may include a class-D audio output stage 42 which may be enabled in the first mode (and disabled in the second mode) to generate audio output signal $V_{OUT}$ as a modulated output signal which is a function of intermediate signal $V_{INT}$ and a class-AB audio output stage 44 which may be enabled in the second mode (and disabled in the first mode) to generate audio output signal $V_{OUT}$ as an unmodulated output signal which is a function of intermediate signal $V_{INT}$.

Class-D audio output stage 42 may comprise any suitable system, device, or apparatus configured to amplify intermediate signal $V_{INT}$ and convert intermediate signal $V_{INT}$ into a series of pulses by pulse-width modulation, pulse-density modulation, or another method of modulation, such that intermediate signal $V_{INT}$ is converted into a modulated signal in which a characteristic of the pulses of the modulated signal (e.g., pulse widths, pulse density, etc.) is a function of the magnitude of intermediate signal $V_{INT}$. After amplification by class-D audio output stage 42, its output pulse train may be converted back to an unmodulated analog signal by passing through a passive low-pass filter, wherein such low-pass filter may be inherent in output circuitry of class-D audio output stage 42 or a load driven by final output stage 24. As shown in FIG. 3A, class-D audio output stage 42 may include a control input for receiving a control input from control circuit 28 in order to selectively enable class-D audio output stage 42 during the first mode and disable class-D audio output stage 42 during the second mode (e.g., prevent class-D audio output stage 42 from driving the amplifier output of amplifier 16 by disabling or decoupling a supply voltage from class-D audio output stage 42 or by disabling or decoupling driving devices of the amplifier output of amplifier 16).

Class-AB audio output stage 44 may comprise any suitable system, device, or apparatus configured to amplify intermediate signal $V_{INT}$ with a linear gain and convert intermediate signal $V_{INT}$ into an unmodulated audio output signal $V_{OUT}$. For example, in some embodiments, unmodulated audio output signal $V_{OUT}$ may include a continuous-time baseband signal (e.g., an audio baseband signal). As shown in FIG. 3A, class-AB audio output stage 44 may include a control input for receiving a control input from control circuit 28 in order to selectively enable class-AB audio output stage 44 during the second mode and disable class-AB audio output stage 44 during the first mode (e.g., prevent class-AB audio output stage 44 from driving the amplifier output of amplifier 16 by disabling or decoupling a supply voltage from class-AB audio output stage 44 or by disabling or decoupling driving devices of the amplifier output of amplifier 16).

As shown in FIG. 3A, final output stage 24 may include a signal feedback network 50 for feeding back a signal indicative of audio output signal $V_{OUT}$ to the input of final output stage 24, thus forming a feedback loop around Class-AB audio output stage 44. For example, as shown in FIG. 3A, signal feedback network 50 may include resistors and/or other suitable circuit elements.

In some embodiments, a signal gain (e.g., $V_{OUT}/V_{INT}$) of final output stage 24 in the first mode may be approximately equal to the signal gain of final output stage 24 in the second mode. In these and other embodiments, an offset (e.g., direct current offset) of final output stage 24 in the first mode may be approximately equal to the offset of final output stage 24 in the second mode.

As shown in FIG. 3A, final output stage 24 may also include a clamp 46, which may be embodied as a switch, coupled between the output terminals of the amplifier output of amplifier 16, with clamp 46 having a control input received from control circuit 28 for selectively enabling clamp 46 (to short the output terminals together) and disabling clamp 46, as described in greater detail below.

Signal feedback network 26 may include any suitable feedback network for feeding back a signal indicative of audio output signal $V_{OUT}$ to the amplifier input of amplifier 16. For example, as shown in FIG. 3A, signal feedback network 26 may include variable feedback resistors 48, wherein resistances of variable feedback resistors 48 are controlled by control signals received from control circuit 28, as described in greater detail below.

Thus, final output stage 24 may operate as an open-loop switched-mode driver in the first mode and may operate as a continuous-time closed-loop amplifier in the second mode. In addition, when the final output stage is operating in the second mode, amplifier 16 may comprise a first feedback loop including signal feedback network 26 and a second feedback loop coupled between the amplifier output and the intermediate output implemented by signal feedback network 50.

Control circuit 28 may include any suitable system, device, or apparatus configured to receive information indicative of audio output voltage $V_{OUT}$, intermediate signal $V_{INT}$, and/or other operational characteristic of amplifier 16, and based at least thereon, control operation of one or more components of amplifier 16. For example, control circuit 28 may be configured to, based on a characteristic of analog input signal $V_{IN}$ (e.g., which may be determined from receiving and analyzing intermediate signal $V_{INT}$ and/or audio output signal $V_{OUT}$), switch between the first mode and the second mode of final output stage 24. Such characteristic may include one or more of a frequency of analog input signal $V_{IN}$, an amplitude of analog input signal $V_{IN}$, a signal-to-noise ratio of analog input signal $V_{IN}$, a noise floor of analog input signal $V_{IN}$, or another noise characteristic of analog input signal $V_{IN}$. For example, in some embodiments, control circuit 28 may be configured to switch final output stage 24 from the first mode to the second mode when an amplitude of analog input signal $V_{IN}$ decreases below a threshold amplitude, and may be configured to switch final output stage 24 from the second mode to the first mode when an amplitude of analog input signal $V_{IN}$ increases above the same threshold amplitude or another threshold amplitude. In some embodiments, to reduce audio artifacts associated with switching between modes, control circuit 28 may also be configured to switch between modes only when the amplitude of audio output signal $V_{OUT}$ is approximately zero (e.g., when a modulated signal generated by class-D audio output stage 42 is at its minimum voltage in its generated pulse train).

In these and other embodiments, control circuit 28 may further be configured to, in order to reduce audio artifacts induced by switching between the two modes, cause final output stage 24 to switch between the first mode and the second mode at an approximate completion of a modulation period of the modulated output signal output by Class-D audio output stage 42, and cause final output stage 24 to switch between the second mode and the first mode at an approximate beginning of another modulation period of the modulated output signal output by Class-D audio output stage 42.

In addition, control circuit 28 may also be configured to perform calibration of final output stage 24. For example, control circuit 28 may receive and analyze intermediate signal $V_{INT}$ and audio output signal $V_{OUT}$ to determine a gain of class-D audio output stage 42 (e.g., the signal gain of final output stage 24 in the first mode) and a gain of class-AB audio output stage 44 (e.g., the signal gain of final output stage 24 in the second mode), and based thereon, modify the gain of class-D audio output stage 42 and/or the gain of class-AB audio output stage 44 in order to calibrate the signal gain of final output stage 24 in the second mode to match the signal gain of final output stage 24 in the first mode. As another example, control circuit 28 may receive and analyze intermediate signal $V_{INT}$ and/or audio output signal $V_{OUT}$ to determine an offset (e.g., direct current offset) of class-D audio output stage 42 (e.g., the offset of final output stage 24 in the first mode) and an offset of class-AB audio output stage 44 (e.g., the offset of final output stage 24 in the second mode), and based thereon, modify the offset of class-D audio output stage 42 and/or the offset of class-AB audio output stage 44 in order to calibrate the offset of final output stage 24 in the second mode to match the offset of final output stage 24 in the first mode.

In these and other embodiments, control circuit 28 may also be configured to control characteristics of first stage 22 (e.g., integrators 30 and/or 32) and/or signal feedback network 26. Control circuit 28 may maintain such characteristics and structure of first stage 22 and signal feedback network 26 as static when switching between the first mode and the second mode of final output stage 24 and when switching between the second mode and the first mode. Maintaining the characteristics and structure of first stage 22 and signal feedback network 26 as static when switching between modes allows the modes to share the same analog front end and feedback network, thus reducing or minimizing the likelihood of mismatched signal gain and offset between the modes, and thus reducing or minimizing audio artifacts caused by switching between modes. However, after control circuit 28 has switched final output stage 24 to the second mode (e.g., amplifier output driven by class-AB audio output stage 44), control circuit 28 may modify characteristics of first stage 22 and/or signal feedback network 26 in order to decrease a noise floor of amplifier 16. For example, in some embodiments, control circuit 28 may modify characteristics of integrator 32 (e.g., resistances and/or capacitances of filters internal to integrator 32) and/or other components of first stage 22 in order to decrease a noise floor of amplifier 16 when final output stage 24 operates in the second mode. As another example, in these and other embodiments, control circuit 28 may modify characteristics of signal feedback network 26 (e.g., resistances of variable feedback resistors 48) in order to decrease a noise floor of amplifier 16 when final output stage 24 operates in the second mode. When making such modification, control circuit 28 may, before switching final output stage from the second mode to the first mode, return such characteristics to their unmodified states. Thus, first stage 22 may be reconfigurable among different modes in which bandwidth, noise, linearity, power consumption, and/or one or more other characteristics first stage 22 may differ among modes. The stimulus or condition for switching among modes of first stage 22 may be similar or identical to the stimulus or condition for switching among modes of final output stage 24, as described elsewhere in this disclosure.

Figure 3B:
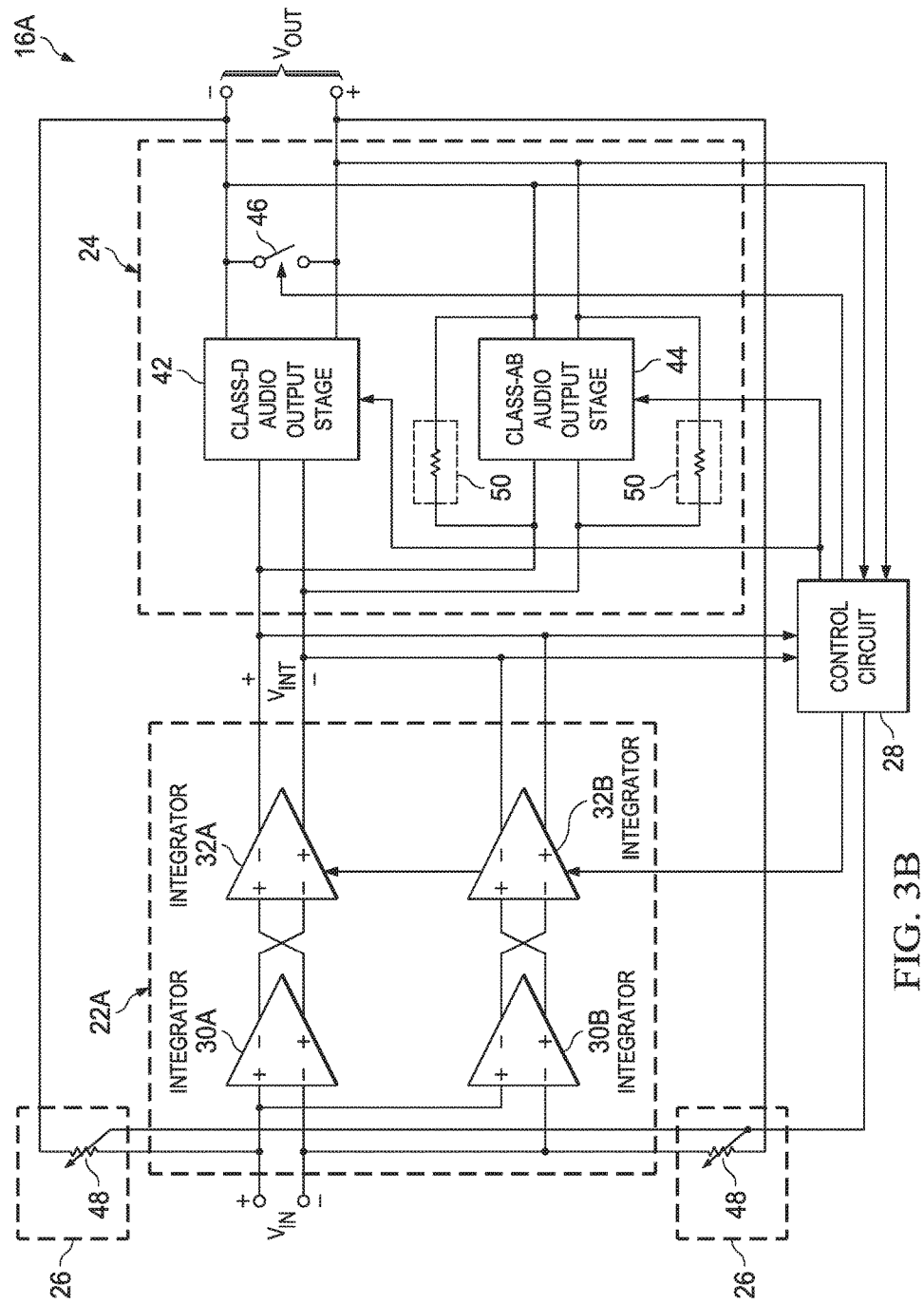
FIG. 3B is a block diagram of selected components of another example amplifier, in accordance with embodiments of the present disclosure.

FIG. 3B is a block diagram of selected components of an example amplifier 16A, in accordance with embodiments of the present disclosure. Amplifier 16A may be similar in many respects to amplifier 16, and thus only the main differences between amplifier 16A and amplifier 16 are discussed below. One main difference between amplifier 16A and amplifier 16 is that amplifier 16A includes a first stage 22A in lieu of first stage 22 of amplifier 16. First stage 22A may be configured to receive analog input signal $V_{IN}$ at an amplifier input of amplifier 16A and generate an intermediate signal $V_{INT}$ which is a function of analog input signal $V_{IN}$.

First stage 22A may include any suitable analog front end circuit for conditioning analog input signal $V_{IN}$ for use by final output stage 24. For example, first stage 22A may include a first set of one or more analog integrators 30A and 32A cascaded in series and a second set of one or more analog integrators 30B and 32B cascaded in series such that the second set is a parallel path to that of the first set, as shown in FIG. 3B. Thus, control circuit 28 may modify characteristics of first stage 22A by switching between the path of integrators 30A and 32A and the path of integrators 30B and 32B in order to maintain desired characteristics of first stage 22A (e.g., as opposed to controlling characteristics of integrator 32 in first stage 22 of amplifier 16 of FIG. 3A in order to maintain desired characteristics). Thus, first stage 22A may be reconfigurable among different modes in which bandwidth, noise, linearity, power consumption, and/or one or more other characteristics first stage 22A may differ among modes. The stimulus or condition for switching among modes of first stage 22A may be similar or identical to the stimulus or condition for switching among modes of final output stage 24, as described elsewhere in this disclosure.

Although FIG. 3B depicts switching between one path of first stage 22A having integrators 30A and 32A and another path of first stage 22A having integrators 30B and 32B, in some embodiments a single integrator 30 may always be used and first stage 22A may switch between two integrators 32A and 32B. In another alternative embodiment, a single integrator 32 may always be used and first stage 22A may switch between two integrators 30A and 30B depicts.

When switching integrators in first stage 22A, steps may also be taken to maintain capacitance voltages between first stage 22A and final output stage 24 when switching between modes of first stage 22A, either by maintaining the same capacitances through parts of the signal path and/or by maintaining state variables (e.g., capacitance voltages) when switching among modes.

Figure 4:
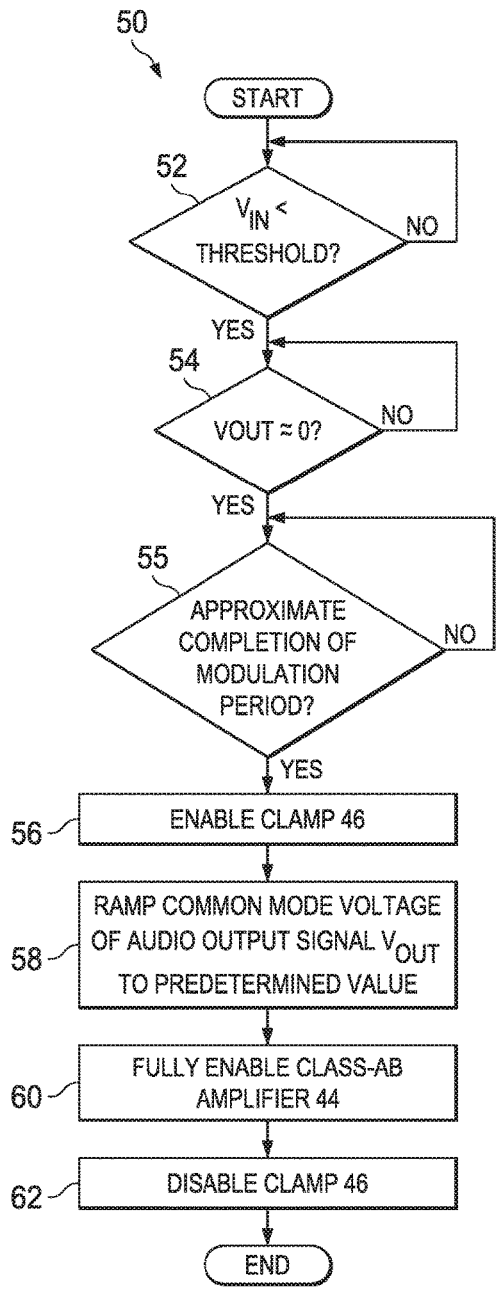
FIG. 4 is a flow chart of an example method for switching between a first mode of a final output stage of an amplifier and a second mode of the final output stage of the amplifier, in accordance with embodiments of the present disclosure.

FIG. 4 is a flow chart of an example method 50 for switching between a first mode of a final output stage 24 of amplifier 16 and a second mode of final output stage 24 of amplifier 16, in accordance with embodiments of the present disclosure. According to some embodiments, method 50 begins at step 52. As noted above, teachings of the present disclosure are implemented in a variety of configurations of personal audio device 1. As such, the preferred initialization point for method 50 and the order of the steps comprising method 50 may depend on the implementation chosen.

At step 52, control circuit 28 may monitor intermediate signal $V_{INT}$, audio output signal $V_{OUT}$, or another signal indicative of analog input signal $V_{IN}$, to determine if analog input signal $V_{IN}$ has decreased from above to below a threshold amplitude. If analog input signal $V_{IN}$ has decreased from above to below the threshold amplitude, method 50 may proceed to step 54. Otherwise, method 50 may remain at step 52 until such threshold amplitude crossing occurs.

At step 54, control circuit 28 may monitor audio output signal $V_{OUT}$ to determine when the amplitude of audio output signal $V_{OUT}$ is approximately zero (e.g., when a modulated signal generated by class-D audio output stage 42 is at its minimum voltage in its generated pulse train). If audio output signal $V_{OUT}$ has reached approximately zero, method 50 may proceed to step 55. Otherwise, method 50 may remain at step 54 until audio output signal $V_{OUT}$ reaches approximately zero.

At step 55, control circuit 28 may monitor audio output signal $V_{OUT}$ to determine when the modulated output signal output by Class-D audio output stage 42 is at an approximate completion of a modulation period. If the modulated output signal output by Class-D audio output stage 42 is at an approximate completion of a modulation period, method 50 may proceed to step 56. Otherwise, method 50 may remain at step 55 until the modulated output signal output by Class-D audio output stage 42 is at an approximate completion of a modulation period.

At step 56, control circuit 28 may enable clamp 46, thus shorting the output terminals at the amplifier output of amplifier 16 together, forcing audio output signal $V_{OUT}$ to zero. At step 58, class-AB audio output stage 44 (or another auxiliary amplifier, not shown in FIG. 3A) may ramp a common mode voltage of audio output signal $V_{OUT}$ to a predetermined value (e.g., one-half of a supply voltage for class-AB audio output stage 44). At step 60, control circuit 28 may fully enable class-AB audio output stage 44 such that audio output signal $V_{OUT}$ is an unmodulated signal which is a function of intermediate signal $V_{INT}$. At step 62, control circuit 28 may disable clamp 46, thus allowing audio output signal $V_{OUT}$ to take on a non-zero value driven by class-AB audio output stage 44. After completion of step 62, method 50 may end.

Although FIG. 4 discloses a particular number of steps to be taken with respect to method 50, method 50 may be executed with greater or fewer steps than those depicted in FIG. 4. In addition, although FIG. 4 discloses a certain order of steps to be taken with respect to method 50, the steps comprising method 50 may be completed in any suitable order.

Method 50 may be implemented using personal audio device 1 or any other system operable to implement method 50. In certain embodiments, method 50 may be implemented partially or fully in software and/or firmware embodied in computer-readable media and executable by a controller.

Figure 5:
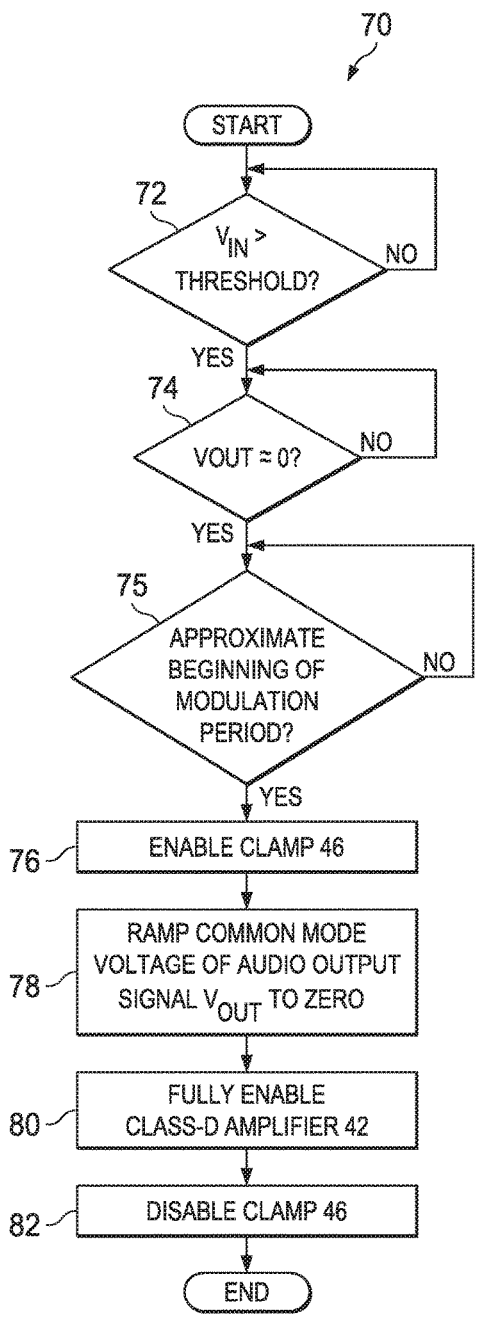
FIG. 5 is a flow chart of an example method for switching between a second mode of a final output stage of an amplifier and a first mode of the final output stage of the amplifier, in accordance with embodiments of the present disclosure.

FIG. 5 is a flow chart of an example method 70 for switching between a second mode of final output stage 24 of amplifier 16 and a first mode of final output stage 24 of amplifier 16, in accordance with embodiments of the present disclosure. According to some embodiments, method 70 begins at step 72. As noted above, teachings of the present disclosure are implemented in a variety of configurations of personal audio device 1. As such, the preferred initialization point for method 70 and the order of the steps comprising method 70 may depend on the implementation chosen.

At step 72, control circuit 28 may monitor intermediate signal $V_{INT}$, audio output signal $V_{OUT}$, or another signal indicative of analog input signal $V_{IN}$, to determine if analog input signal $V_{IN}$ has increased from below to above a threshold amplitude (which may be the same threshold as that of step 52, or a different threshold). If analog input signal $V_{IN}$ has increased from below to above the threshold amplitude, method 70 may proceed to step 74. Otherwise, method 70 may remain at step 72 until such threshold amplitude crossing occurs.

At step 74, control circuit 28 may monitor audio output signal $V_{OUT}$ to determine when the amplitude of audio output signal $V_{OUT}$ is approximately zero (e.g., when audio output signal $V_{OUT}$ experiences a zero crossing). If audio output signal $V_{OUT}$ is approximately zero, method 70 may proceed to step 75. Otherwise, method 70 may remain at step 74 until audio output signal $V_{OUT}$ is approximately zero.

At step 75, control circuit 28 may monitor audio output signal $V_{OUT}$ to determine when the modulated output signal output by Class-D audio output stage 42 is at an approximate beginning of a modulation period. If the modulated output signal output by Class-D audio output stage 42 is at an approximate beginning of a modulation period, method 70 may proceed to step 76. Otherwise, method 70 may remain at step 75 until the modulated output signal output by Class-D audio output stage 42 is at an approximate beginning of a modulation period.

At step 76, control circuit 28 may enable clamp 46, thus shorting the output terminals at the amplifier output of amplifier 16 together, forcing audio output signal $V_{OUT}$ to zero. At step 78, class-D audio output stage 42 (or another auxiliary amplifier, not shown in FIG. 3A) may ramp a common mode voltage of audio output signal $V_{OUT}$ to zero. At step 80, control circuit 28 may fully enable class-D audio output stage 42 such that audio output signal $V_{OUT}$ is a modulated signal which is a function of intermediate signal $V_{INT}$. At step 82, control circuit 28 may disable clamp 46, thus allowing audio output signal $V_{OUT}$ to take on a non-zero value driven by class-D audio output stage 42. After completion of step 82, method 70 may end.

Although FIG. 5 discloses a particular number of steps to be taken with respect to method 70, method 70 may be executed with greater or fewer steps than those depicted in FIG. 5. In addition, although FIG. 5 discloses a certain order of steps to be taken with respect to method 70, the steps comprising method 70 may be completed in any suitable order.

Method 70 may be implemented using personal audio device 1 or any other system operable to implement method 70. In certain embodiments, method 70 may be implemented partially or fully in software and/or firmware embodied in computer-readable media and executable by a controller.

Figure 6:
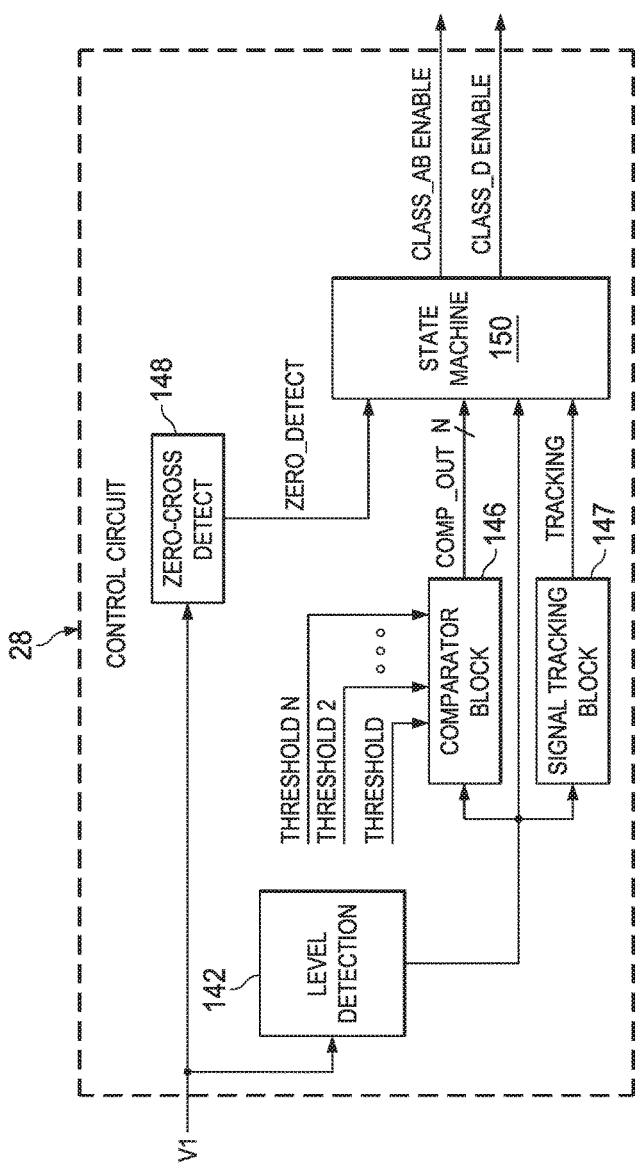
FIG. 6 is a block diagram of selected components of a control circuit for use within the example amplifier depicted in FIG. 3, in accordance with embodiments of the present disclosure.

FIG. 6 is a block diagram of selected components of an example control circuit 28 for use within or in connection with amplifier 16, in accordance with embodiments of the present disclosure. As shown in FIG. 6, control circuit 28 may include a level detection circuit 142, a comparator block 146, a signal tracking block 147, a zero-cross detection circuit 148, and a state machine 150. Level detection circuit 142 may include any suitable system, device, or apparatus for receiving an input signal $V_I$ indicative of output signal $V_{OUT}$, determining a magnitude of such signal, and outputting a signal indicative of such magnitude. Comparator block 146 may compare the output signal of level detection circuit 142 with N predetermined threshold magnitudes, wherein N is a positive integer, and based on such comparison, output a signal COMP_OUT (which may comprise N bits) indicative of whether the desired magnitude of input signal $V_I$ is greater or lesser than each of such predetermined threshold magnitudes. In some embodiments, such predetermined threshold magnitudes may be relative to a full-scale voltage of input signal $V_I$ and/or audio output signal $V_{OUT}$. In some embodiments, comparator block 146 may implement hysteresis, such that signal COMP_OUT or a bit thereof may only transition if the output signal of level detection block 42 remains above or below a predetermined threshold magnitude for a minimum duration of time (e.g., 0.1 seconds to place any switching artifacts outside the human-perceptible audio range).

Zero-cross detection circuit 148 may include any suitable system, device, or apparatus for detecting the occurrence of a zero crossing of input signal $V_I$ (or a derivative thereof) and outputting a signal ZERO_DETECT indicating that a zero crossing of such signal has occurred. A zero crossing of a signal may occur when the waveform of such signal crosses a magnitude of zero or crosses another level within a threshold of zero and indicative of a zero crossing (e.g., a low signal level of lower than −70 dB or within a small number of least significant bits of zero).

Signal tracking block 147 may comprise any suitable system, device, or apparatus for tracking a particular parameter of an audio signal, including without limitation a plurality of peaks of such audio signal and/or a signal envelope of such audio signal, and based thereon, generate an output signal TRACKING indicative of such tracked parameter.

State machine 150 may receive signals COMP_OUT, TRACKING, and ZERO_DETECT, and based on one or more of such signals, generate one or more control signals (e.g. CLASS-AB ENABLE, CLASS D ENABLE, etc.) for switching between modes of amplifier 16, as described in greater detail elsewhere in this disclosure. For example, when the magnitude of input signal $V_I$ transitions from above to below a predetermined threshold magnitude (e.g., −24 dB), signal COMP_OUT may indicate such transition and in response, state machine 150 may wait until the occurrence of a zero crossing (as indicated by signal ZERO_ETECT), after which it may cause amplifier 16 to switch from the first mode (e.g., in which Class-D audio output stage 42 is enabled) to the second mode (e.g., in which Class-AB audio output stage 44 is enabled). By changing between modes at a zero crossing of input signal $V_I$ (or a derivative thereof), the change and any auditory artifacts associated with the change may be masked and therefore be unnoticeable or less noticeable to a listener of an audio device including audio IC 9.

As another example, when the magnitude of input signal $V_I$ transitions from below to above a predetermined threshold magnitude (e.g., −24 dB), signal COMP_OUT may indicate such transition, and in response state machine 150 may cause amplifier 16 to switch from the second mode (e.g., in which Class-AB audio output stage 44 is enabled) to the first mode (e.g., in which Class-D audio output stage 42 is enabled). However, when transitioning to the first mode, it may not be desirable to wait for a zero cross of the output signal, as a transition from below to above the predetermined threshold magnitude may almost immediately lead to clipping of the audio signal. Accordingly, it may be desirable to predict whether the magnitude of input voltage $V_I$ is likely to cross such predetermined threshold and switch the amplifier mode responsive to such prediction at a zero crossing event of input voltage $V_I$ occurring before crossing of the predetermined threshold by input voltage $V_I$. By applying such predictive techniques, examples of which are explained below and illustrated by FIGS. 7-10, control circuit 28 may facilitate switching between amplifier modes to increase dynamic range while reducing audio artifacts. FIGS. 7 through 10 illustrate example waveforms demonstrating predictive methodologies that may be performed by control circuit 28. In each of FIGS. 7 through 10, the y-axis represents a voltage of input voltage $V_I$ given in decibels relative to a full-scale voltage of input voltage $V_I$.

As depicted in the example waveform graph for input signal $V_I$ versus time shown in FIG. 7, control circuit 28 may predict whether the magnitude of input voltage $V_I$ is likely to cross a predetermined primary threshold by determining whether input voltage $V_I$ (or a derivative thereof) crosses a secondary threshold. To illustrate, to predict whether input voltage $V_I$ will increase above a primary threshold for switching between modes of amplifier 16 (e.g., −24 dB relative to full-scale voltage of input voltage $V_I$), control circuit 28 may monitor (e.g., with comparator block 146) whether input voltage $V_I$ increases above a secondary threshold (e.g., −25 dB relative to full-scale voltage of input voltage $V_I$) lower than the primary threshold, which occurs at time $t_1$ shown in FIG. 7. Responsive to input voltage $V_I$ increasing above such secondary threshold, control circuit 28 may wait for the next zero-crossing event of input voltage $V_I$ (e.g., as detected by zero-cross detection circuit 148) which occurs at time $t_2$ shown in FIG. 7. At such zero-cross event, control circuit 28 may cause amplifier 16 to switch from the second mode to the first mode. When input voltage $V_I$ subsequently increases above the primary threshold (e.g., above −24 dB), which occurs at time $t_3$ shown in FIG. 7, no changes to the mode of amplifier 16 may occur, as such change already occurred at the previous zero-crossing event.

In some embodiments, state machine 150 may also implement a timing element (e.g., a timer or counter) in connection with a secondary threshold to determine whether input voltage $V_I$ will increase above a primary threshold. To illustrate, to predict whether input voltage $V_I$ will increase above a primary threshold (e.g., −21 dB relative to full-scale voltage of input voltage $V_I$) for switching from the second mode to the first mode, control circuit 28 may monitor (e.g., with comparator block 146) whether input voltage $V_I$ increases above a secondary threshold (e.g., −22 dB relative to input voltage $V_I$) lower than the primary threshold, which occurs at time $t_4$ shown in FIG. 7. Responsive to input voltage $V_I$ increasing above such secondary threshold, control circuit 28 may wait for the next zero-crossing event of input voltage $V_I$ (e.g., as detected by zero-cross detection circuit 148) which occurs at time $t_5$ shown in FIG. 7. At such zero-cross event, control circuit 28 may switch from the second mode to the first mode. In addition, responsive to input voltage $V_I$ increasing above such secondary threshold at time $t_4$, state machine 150 may initiate a timing element to time a duration beginning at the time $t_4$ in which input voltage $V_I$ increases above such secondary threshold. If, prior to the duration of time expiring, input voltage $V_I$ increases above the primary threshold, control circuit 28 may maintain the mode (e.g., the first mode) of amplifier 16 at which it was at the zero-crossing event at time $t_5$. Otherwise, if the duration of time expires, shown as time $t_6$ in FIG. 7, prior to input voltage $V_I$ increasing above the primary threshold, control circuit 28 may predict that an increase above the primary threshold may not occur, and may switch to the mode (e.g., the second mode) of amplifier 16 prior to the zero-crossing event at time $t_5$.

In these and other embodiments, control circuit 28 may employ signal tracking techniques to predict whether input voltage $V_I$ may increase above a secondary threshold. For example, control circuit 28 (e.g., via signal tracking block 147) may track a peak trend of the magnitude peaks of input voltage $V_I$ as shown in FIG. 7. From tracking the magnitude peaks, control circuit 28 may extrapolate the trend to determine if the magnitude of input voltage $V_I$ is trending towards increasing above a primary threshold (e.g., −24 dB relative to full-scale voltage of input voltage $V_I$). Additionally or alternatively to tracking peak trends, control circuit 28 (e.g., via signal tracking block 147) may similarly track a signal envelope of input voltage $V_I$ to determine whether input voltage $V_I$ is trending towards increasing above a primary threshold.

Although FIG. 7 and the foregoing description thereof has depicted use of predictive approaches for determining whether input voltage $V_I$ is likely to increase from below to above a primary threshold, similar approaches (e.g., secondary thresholds, timing elements, peak tracking, signal envelope tracking, etc.) may also be used to determine whether input voltage $V_I$ is likely to decrease from above to below a primary threshold and switch between modes of amplifier 16 in response to such predictions.

In addition or alternatively to the embodiments discussed above, control circuit 28 may employ a secondary threshold and a timing element to predict whether magnitude of input voltage $V_I$ is to decrease below a predetermined primary threshold and remain below such primary threshold, as illustrated in FIG. 8. In the embodiments represented by FIG. 8, state machine 150 may initiate a timing element for a predetermined duration whenever the magnitude of input voltage $V_I$ decreases from above to below a primary threshold (e.g., −24 dB relative to full-scale voltage of input voltage $V_I$) shown as times $t_1$ and $t_4$ in FIG. 8. If prior to the duration of time expiring, input voltage $V_I$ increases above a secondary threshold (e.g., −25 dB relative to full-scale voltage of input voltage $V_I$) lesser than the primary threshold shown as times $t_2$, $t_3$, and $t_6$ in FIG. 8, the timing element may reset the predetermined duration of time. Upon expiration of the duration of time, shown as occurring at time $t_7$ in FIG. 8, thus indicating that input voltage $V_I$ has not increased above the secondary threshold for longer than the duration of time, and provided that input voltage $V_I$ is below the primary threshold, control circuit 28 may thus predict that input voltage $V_I$ is and will remain below the primary threshold, and accordingly switch amplifier 16 to the second mode (e.g., in which Class-AB audio output stage 44 is enabled). By using this predictive methodology, control circuit 28 may avoid switching events if the magnitude of input voltage $V_I$ falls below the primary threshold but then in a short amount of time rises above the primary threshold again for a brief period of time. For example, in the graph depicted in FIG. 8, this predictive methodology prevents amplifier-mode switching events from occurring at times $t_4$ and $t_5$.

Figure 9:
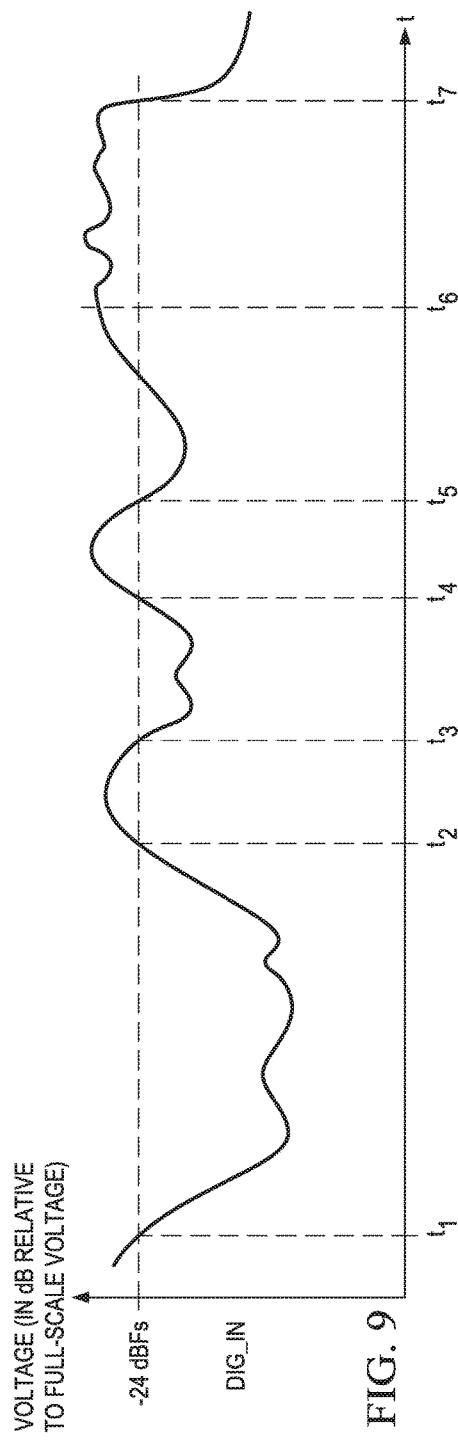

In addition or alternatively to the embodiments discussed above, control circuit 28 may employ one or more timing elements to disable switching between amplifier modes when the magnitude of input voltage $V_I$ hovers near a primary threshold, as illustrated in FIG. 9. In the embodiments represented by FIG. 9, upon the magnitude of input voltage $V_I$ crossing a primary threshold (e.g., −24 dB relative to full-scale voltage of input voltage $V_I$ shown as times $t_1$, $t_2$, $t_3$, $t_4$, $t_5$, $t_6$, and $t_7$ in FIG. 9), state machine 150 may initiate a timing element for a predetermined duration. If prior to the predetermined duration of time expiring, input voltage $V_I$ again crosses the primary threshold (e.g., the difference between times $t_2$ and each of times $t_3$, $t_4$, and/or $t_5$ may be less than the predetermined duration of time), control circuit 28 may disable switching between amplifier modes (e.g., switching would not occur at times $t_3$, $t_4$, and $t_5$). Upon expiration of the predetermined duration of time, shown as occurring at time $t_6$ in FIG. 9 (e.g., the difference between time $t_5$ and time $t_6$ may be more than the predetermined duration of time), thus indicating that input voltage $V_I$ has not crossed the primary threshold for longer than the predetermined duration of time, control circuit 28 may thus predict that input voltage $V_I$ has not crossed the primary threshold for a period of time and may re-enable switching between amplifier modes when input voltage $V_I$ again crosses the primary threshold, shown as time $t_7$ in FIG. 9. By using this predictive methodology, control circuit 28 may avoid multiple switching events if the magnitude of input voltage $V_I$ hovers near the primary threshold.

Figure 10:
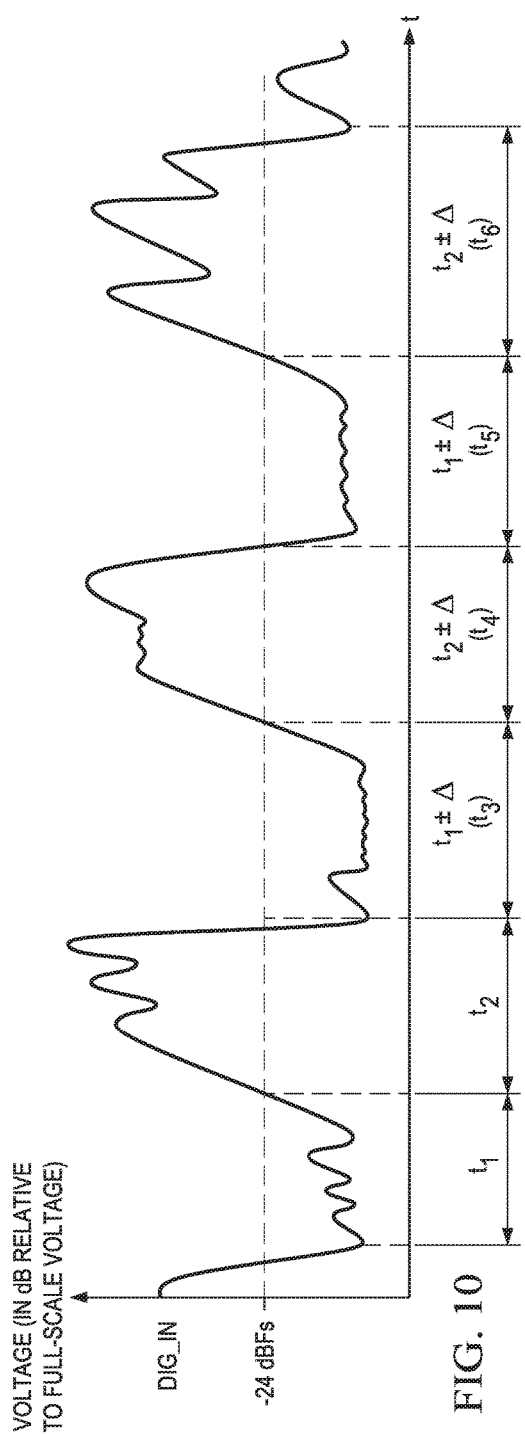

In addition or alternatively to the embodiments discussed above, control circuit 28 may be configured to predict when input voltage $V_I$ has a persistent pattern of magnitude relative to a primary threshold, as illustrated in FIG. 10. To predict a persistent pattern, state machine 150 may record a period of time $t_1$ in which input voltage $V_I$ remains below a primary threshold (e.g., −24 dB relative to full-scale voltage of input voltage $V_I$) and record a period of time $t_2$ in which input voltage $V_I$ remains above the primary threshold. For one or more subsequent periods (e.g., time periods $t_3$, $t_5$) in which input voltage $V_I$ is below the primary threshold, state machine 150 may determine a duration of such periods and compare them to the duration of the recorded period of time $t_1$. If the one or more subsequent periods are within a certain duration of time $\Delta$ of the recorded period of time $t_1$ (e.g., $t_1-\Delta \le t_3 \le t_1+\Delta$), control circuit 28 may determine that input voltage $V_I$ has a persistent pattern. Similarly, for one or more subsequent periods (e.g., time periods $t_4$, $t_6$) in which input voltage $V_I$ is above the primary threshold, state machine 150 may determine a duration of such periods and compare them to the duration of the recorded period of time $t_2$. If the one or more subsequent periods are within a certain duration of time $\Delta$ of the recorded period of time $t_1$ (e.g., $t_2-\Delta \le t_4 \le t_2+\Delta$), control circuit 28 may determine that input voltage $V_I$ has a persistent pattern. In some embodiments, responsive to determining that a persistent pattern exists, control circuit 28 may disable switching between modes of amplifier 16. In other embodiments, when a persistent pattern exists, control circuit 28 may use information regarding the persistent pattern (e.g., time periods $t_1$ and/or $t_2$) to predict occurrence of a future crossing of the primary threshold by input voltage $V_I$, and cause a switch between amplifier modes at a zero-crossing event occurring immediately before the future crossing of the primary threshold.

Using the methods and systems herein disclosed, changes in an amplifier mode of a signal path and audio artifacts associated therewith may be masked by predicting an amplifier mode threshold-crossing and in response to such prediction, pre-emptively switching ahead of such threshold-crossing at a zero-crossing of an audio signal. In the case of quickly-rising signals that cross a threshold for switching between amplifier modes, such prediction and preemptive switching at a zero-crossing may not be necessary to avoid audio artifacts, as a quickly-rising transient nature of a signal may mask audio artifacts. However, in the case of a slower-rising signal that crosses an amplifier mode threshold-crossing, the transient effects may not mask audio artifacts, and thus the methods and systems disclosed herein for predicting an amplifier mode threshold-crossing and in response to such prediction may be employed to mask such artifacts.

Figure 11:
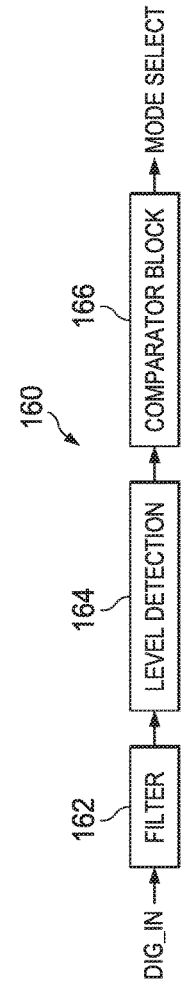
FIG. 11 is a block diagram of selected components of an example control subcircuit that may be used within a state machine, in accordance with embodiments of the present disclosure.

In addition to the foregoing functionality, state machine 150 may also be configured to determine a spectral content of a signal indicative of output voltage signal $V_{OUT}$ (e.g., input voltage $V_I$) and may switch the amplifier mode based on the spectral content. To illustrate, FIG. 11 depicts an example control subcircuit 160 that may be used within state machine 150 for determining whether to switch between amplifier modes based on the spectral content, in accordance with embodiments of the present disclosure. As shown in FIG. 11, control subcircuit 160 may comprise a filter 162, a level detection circuit 164, and a comparator block 166. Filter 162 may comprise any suitable system, device, or apparatus for receiving input voltage $V_I$ (or a derivative thereof), and outputting a filtered signal in accordance with a filter response of filter 162. In some embodiments, filter 162 may comprise one of a low-pass filter, a bandpass filter, and a high-pass filter. In these and other embodiments, filter 162 may comprise a filter designed to mimic an auditory responsiveness of a human ear.

Level detection circuit 164 may include any suitable system, device, or apparatus for receiving the filtered signal generated by filter 162, determining a magnitude of such signal, and outputting a signal indicative of such magnitude. Comparator block 166 may compare the output signal of level detection circuit 162 with a predetermined threshold magnitude, and based on such comparison, output a signal MODE_SELECT indicative of whether the filtered signal is greater or lesser than such predetermined threshold magnitude. The signal MODE_SELECT may indicate whether to change between amplifier modes of amplifier 16. For example, if the filtered signal generated by filter 162 is above the predetermined threshold magnitude, state machine 150 may switch amplifier 16 from the second mode (e.g., Class-AB audio output stage 44 enabled) to the first mode (e.g., Class-D audio output stage 42 enabled). On the other hand, if the filtered signal generated by filter 162 is below the predetermined threshold magnitude, state machine 150 may switch amplifier 16 from the first mode (e.g., Class-D audio output stage 42 enabled) to the second mode (e.g., Class-AB audio output stage 44 enabled).

In these and other embodiments, the spectral content of output voltage signal $V_{OUT}$ may be used to vary other parameters associated with changing the amplifier mode of amplifier 16. For example, as described above, in some embodiments, state machine 150 may change amplifier modes based on a signal indicative of output voltage signal $V_{OUT}$ crossing a threshold magnitude (e.g., either from below to above the threshold magnitude or vice versa). In such embodiments, such threshold magnitude for changing amplifier modes may be based on the spectral content of a signal indicative of output voltage signal $V_{OUT}$ (e.g., input signal $V_I$). In other words, in such embodiments, comparator block 166 of FIG. 11 may be modified such that based on the signal output by level detection circuit 164, comparator block 166 would output a control signal setting a threshold magnitude for changing amplifier modes of amplifier 16. Accordingly, if sufficient signal energy is present within the pass band frequencies of filter 1, state machine 150 may apply a first threshold magnitude as the condition for changing between amplifier modes, and if sufficient signal energy is not present within the pass band frequencies of filter 162, state machine 150 may apply a second threshold magnitude as the condition for changing between amplifier modes.

In yet other embodiments, the spectral content of the signal indicative of output voltage signal $V_{OUT}$ may be used as a basis of whether to change amplifier modes. As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An apparatus comprising:
   an amplifier comprising:
      a plurality of stages comprising at least:
         a first stage configured to receive an input signal at an amplifier input and generate an intermediate signal at an intermediate output which is a function of the input signal; and
         a final output stage configured to generate an output signal at an amplifier output, wherein the output signal is a function of the intermediate signal; and
         a signal feedback network coupled between the amplifier output and the amplifier input;
      wherein the final output stage is switchable among a plurality of modes including at least:
         a first mode in which the final output stage generates the output signal as a modulated output signal which is a function of the intermediate signal; and
         a second mode in which the final output stage generates the output signal as an unmodulated output signal which is a function of the intermediate signal; and
      wherein structure of the signal feedback network and the first stage remain static when switching between the first mode and the second mode; and
   a control circuit configured to:
      determine a spectral content of a signal indicative of an output signal at the output of the final output stage; and
      switch between the first mode and the second mode based on the spectral content.

2. The apparatus of claim 1, wherein the control circuit is configured to switch between the first mode and the second mode responsive to the signal crossing a threshold magnitude.

3. The apparatus of claim 1, wherein the control circuit is configured to switch between the first mode and the second mode of the plurality of modes at a zero crossing of the signal.

4. The apparatus of claim 1, wherein the control circuit is configured to switch between the first mode and the second mode responsive to the signal crossing a threshold magnitude and expiration of a duration of time after crossing the threshold magnitude.

5. The apparatus of claim 1, wherein the control circuit is further configured to switch between the first mode and the second mode responsive to the spectral content having spectral components in a particular range of frequencies.

6. The apparatus of claim 1, wherein the control circuit is further configured to switch between the first mode and the second mode responsive to the signal crossing a threshold magnitude, wherein the threshold magnitude is based on the spectral content.

7. The apparatus of claim 1, wherein the control circuit is configured to determine the spectral content of the signal indicative of the output signal by applying a filter to the signal indicative of the output signal to generate a filtered signal and detecting a magnitude of the filtered signal.

8. The apparatus of claim 7, wherein the filter comprises a filter designed to mimic an auditory responsiveness of a human ear.

9. The apparatus of claim 7, wherein the filter comprises one of a low-pass filter, a bandpass filter, and a high-pass filter.

10. The apparatus of claim 1, wherein the modulated output signal comprises a pulse-modulated signal.

11. The apparatus of claim 10, wherein the pulse-modulated signal comprises one of a pulse-width modulated signal and a pulse-density modulated signal.

12. The apparatus of claim 1, wherein the unmodulated output signal comprises a continuous-time baseband signal.

13. The apparatus of claim 1, wherein:
the amplifier comprises a Class-D modulator; and
the final output stage operates as an open-loop switched-mode driver in the first mode and operates as a continuous-time closed-loop amplifier in the second mode.

14. The apparatus of claim 1, wherein when the final output stage is operating in the second mode, the amplifier comprises a first feedback loop including the signal feedback network and a second feedback loop coupled between the amplifier output and the intermediate output.

15. The apparatus of claim 1, wherein switching between the first mode and the second mode comprises at least one of:
switching from the first mode to the second mode; and
switching from the second mode to the first mode.

16. The apparatus of claim 1, wherein the first stage is switchable among a plurality of modes wherein one or more characteristics of the first stage are different among the plurality of modes.

17. The apparatus of claim 16, wherein the control circuit is further configured to, responsive to switching between the first mode and the second mode, switch between two modes of the plurality of modes of the first stage.

18. The apparatus of claim 16, wherein:
the first stage comprises an integrator; and
the control circuit is further configured to, responsive to switching between the first mode and the second mode, modify the one or more characteristics of the integrator in order to switch between two modes of the plurality of modes of the first stage.

19. The apparatus of claim 16, wherein:
the first stage comprises a first integrator and a second integrator in parallel with the first integrator; and
the control circuit is further configured to, responsive to switching between the first mode and the second mode, switch between enabling the first integrator and enabling the second integrator in order to switch between two modes of the plurality of modes of the first stage.

20. A method for operating an amplifier having a plurality of stages comprising at least a first stage configured to receive an input signal at an amplifier input and generate an intermediate signal which is a function of the input signal, and a final output stage configured to generate an output signal at an amplifier output, wherein the output signal is a function of the intermediate signal, and a signal feedback network coupled between the amplifier output and the amplifier input, the method comprising, switching the final output stage among a plurality of modes including at least a first mode in which the final output stage generates the output signal as a modulated output signal which is a function of the intermediate signal, and a second mode in which the final output stage generates the output signal as an unmodulated output signal which is a function of the intermediate signal, wherein structure of the signal feedback network and the first stage remain static when switching between the first mode and the second mode and when switching between the second mode and the first mode, the method comprising:
determining a spectral content of a signal indicative of an output signal at the output of the final output stage; and
switching between the first mode and the second mode based on the spectral content.

21. The method of claim 20, further comprising switching between the first mode and the second mode responsive to the signal crossing a threshold magnitude.

22. The method of claim 20, further comprising switching between the first mode and the second mode of the plurality of modes at a zero crossing of the signal.

23. The method of claim 20, further comprising switching between the first mode and the second mode responsive to the signal crossing a threshold magnitude and expiration of a duration of time after crossing the threshold magnitude.

24. The method of claim 20, further comprising switching between the first mode and the second mode responsive to the spectral content having spectral components in a particular range of frequencies.

25. The method of claim 20, further comprising switching between the first mode and the second mode responsive to the signal crossing a threshold magnitude, wherein the threshold magnitude is based on the spectral content.

26. The method of claim 20, further comprising determining the spectral content of the signal indicative of the output signal by applying a filter to the signal indicative of the output signal to generate a filtered signal and detecting a magnitude of the filtered signal.

27. The method of claim 26, wherein the filter comprises a filter designed to mimic an auditory responsiveness of a human ear.

28. The method of claim 26, wherein the filter comprises one of a low-pass filter, a bandpass filter, and a high-pass filter.

29. The method of claim 20, wherein the modulated output signal comprises a pulse-modulated signal.

30. The method of claim 29, wherein the pulse-modulated signal comprises one of a pulse-width modulated signal and a pulse-density modulated signal.

31. The method of claim 20, wherein the unmodulated output signal comprises a continuous-time baseband signal.

32. The method of claim 20, wherein:
  the amplifier comprises a Class-D modulator; and
  the final output stage operates as an open-loop switched-mode driver in the first mode and operates as a continuous-time closed-loop amplifier in the second mode.

33. The method of claim 20, wherein when the final output stage is operating in the second mode, the amplifier comprises a first feedback loop including the signal feedback network and a second feedback loop coupled between the amplifier output and the intermediate output.

34. The method of claim 20, wherein switching between the first mode and the second mode comprises at least one of:
  switching from the first mode to the second mode; and
  switching from the second mode to the first mode.

35. The method of claim 20, wherein the first stage is switchable among a plurality of modes wherein one or more characteristics of the first stage are different among the plurality of modes.

36. The method of claim 35 further comprising, responsive to switching between the first mode and the second mode, switching between two modes of the plurality of modes of the first stage.

37. The method of claim 35, wherein:
  the first stage comprises an integrator; and
  the method further comprises, responsive to switching between the first mode and the second mode, modifying the one or more characteristics of the integrator in order to switch between two modes of the plurality of modes of the first stage.

38. The method of claim 35, wherein:
  the first stage comprises a first integrator and a second integrator in parallel with the first integrator; and
  the method further comprises, responsive to switching between the first mode and the second mode, switching between enabling the first integrator and enabling the second integrator in order to switch between two modes of the plurality of modes of the first stage.

* * * * *